United States Patent

Wu

Patent Number: 6,010,934
Date of Patent: Jan. 4, 2000

[54] METHOD OF MAKING NANOMETER SI ISLANDS FOR SINGLE ELECTRON TRANSISTORS

[75] Inventor: Shye-Lin Wu, Hsinchu, Taiwan

[73] Assignee: Texas Instruments - Acer Incorporated, Hsinchu, Taiwan

[21] Appl. No.: 09/033,527

[22] Filed: Mar. 2, 1998

[51] Int. Cl.$^7$ ............................................. H01L 21/336
[52] U.S. Cl. ......................... 438/264; 438/257; 438/947
[58] Field of Search .................... 438/257, 264, 438/947; 257/9, 24, 321, 347

[56] References Cited

U.S. PATENT DOCUMENTS

| | | | |
|---|---|---|---|
| 4,400,865 | 8/1983 | Goth et al. | 438/303 |
| 5,593,813 | 1/1997 | Kim | 430/312 |
| 5,886,380 | 3/1999 | Nakajima | 257/321 |
| 5,923,981 | 7/1999 | Qian | 438/284 |

OTHER PUBLICATIONS

Guo et al., "Si Single–Electron MOS Memory With Nanoscale Floating–Gate and Narrow Channel", IEDM 96, pp. 955–956, 1996.

Anri Nakajima et al., Room Temperature Operation of Si Single–Electron Memory with Self–Aligned Floating Dot Gate, IEDM 1996, pp. 952–956.

Nobuyuki Yoshikawa et al., Single–Electron–Tunneling Effect in Nanoscale Granular Microbridges, Jpn. J. Appl. Phys. vol. 36, Pt. 1, No. 6B, Jun. 1997, pp. 4161–4165.

*Primary Examiner*—John F. Niebling
*Assistant Examiner*—John Murphy
*Attorney, Agent, or Firm*—Harness, Dickey & Pierce, P.L.C.

[57] ABSTRACT

A method of making nanometer Si islands for single electron transistors is disclosed. Initially, a pad oxide is deposited over a silicon substrate. Oxygen ions are implanted into the silicon substrate to form an oxygen amorphized region and a high-temperature annealing is performed to form a buried oxide layer in the silicon substrate. Then, a thermal silicon oxide is formed to reduce the thickness of the silicon substrate on the buried oxide layer. The thermal oxide is removed and an ultra-thin oxide layer is then formed on the silicon substrate. A plurality of silicon nitride blocks is formed on the ultra-thin silicon oxide. Afterwards, the spacers of the silicon nitride blocks are formed. The silicon nitride blocks are removed by using wet etching technique. The ultra-thin silicon oxide is etched back and the polysilicon spacers are used as hard mask to Si substrate to form a plurality of nanometer silicon islands. The ultra-thin silicon oxide is removed and an ultra-thin oxynitride layer is regrown on the nanometer silicon islands. Finally, a n+ polysilicon layer is conformally deposited onto the silicon substrate and the nanometer silicon islands.

18 Claims, 4 Drawing Sheets

METHOD OF MAKING NANOMETER SI ISLANDS FOR SINGLE ELECTRON TRANSISTORS

FIELD OF THE INVENTION

The present invention relates to a method of manufacturing the nanometer Si islands on silicon wafers, and more specifically, to a method of fabricating single electron transistors on the silicon wafers.

BACKGROUND OF THE INVENTION

The single electron transistor (SET) has become an essential element in electronics. The devices are operated by utilizing the Coulomb Blockade effect. However, the operation of SET device operation has been limited to below 4 K. The reason is that the smallest capacitance of the SET has been about 100 aF. This means that a charging energy $e^2/(2C)$ is much larger than the thermal energy, which could be met at very low temperature. In IEDM Tech. Dig. in the page 938 on 1994, Y. Takajashi et al. reported a Si-SET whose capacitance is only about 2 aF. The Si-SET is reported in this paper shows conductance oscillation even at room temperature is reported in this paper. Thus, using semiconductor technique, a SET can be fabricated in a substrate and it is operated at room temperature. In this paper, a process which is separation by implanted oxygen (SIMOX) is used to form a superficial Si layer. The SET device is fabricated in the superficial Si layer. Then, by using semiconductor technique, the author fabricated an one-dimensional Si wire in the superficial Si layer. The Si wire width can be in the order of nanometer.

Recently, the room temperature operation of a single-electron memory was realized by a device using nanometer-sized, polycrystalline fine-grain Si for a floating gate and channel. In IEDM Tech. Dig., in page 952 on 1996, A. Nakajima et al reported a Si single-electron memory with self-aligned floating gate. The authors reported a new Si single-electron memory device comprised of a narrow channel field effect transistor (FET) having an ultra-small self-aligned floating dot gate, which is capable to exhibit clear, single-electron memory effects at room temperature. In this paper, the Si single-electron FET memory has a width of about 30 nanometers and is operated at room temperature.

Many efforts are made to fabricate silicon-based SET devices. The smallest dimension required for SET operation depends on non-artificial process such as grain control and inhomogeneous oxidation, which can be hardly determined in the design stage. In page 955 of IEDM Tech. Dig. on 1996, L. Guo et al reported that a Si single-electron MOS memory (SEMM) is fabricated and the electrical characteristic of the device are detected. The device has a nanoscale floating-gate and a narrow gate. The capacitance for the 7 nm×7 nm floating gate and a 40 nm control oxide is $4\times10^{-20}$ F, giving single electron charging voltage of 4 V. The SEMM device was fabricated by using silicon on insulator (SOI) technique. The channel of the device was fabricated using e-beam lithography and reactive ion etching. The channel had a width varying from 25 nm to 120 nm.

In page 4161 of vol. 36, Jpn. J. Appl. Phys., on 1997, N. Yoshikawa et al reported a single-electron-tunneling effect in nanoscale granular microbridge. The granular microbridge was fabricated on an oxide step. A thin film was deposited on the oxide step. An ion etching was performed at an angle of 45 degrees and a microbridge was formed beside the oxide step.

In the last two papers, the methods of fabricating the single electron channel are nonartifical and difficult to control. In another words, designers are hard to design a good structure and to control the dimension of the channel. Thus, a simple and stable process method to fabricate the single electron transistor is essentially necessary.

SUMMARY OF THE INVENTION

A method of manufacturing a memory array of single electron transistors is disclosed in the present invention. Initially, a pad oxide is formed over a silicon substrate. An ion implantation is performed on the silicon substrate in order to form an oxygen amorphized region in the silicon substrate. After the ion implantation of the silicon substrate, a high-temperature annealing process is used to form a buried layer and the depth of the buried layer is between about 0.3 to 0.5 micrometers. A thermal oxide is then formed on the silicon substrate to reduce the thickness of the silicon substrate on the buried layer. The thermal oxide is removed and an ultra-thin oxide is formed on the silicon substrate. Afterwards, several silicon nitride blocks are formed on the ultra-thin oxide to define isolation patterns. A polysilicon layer is deposited on the silicon nitride blocks and then etched back to form polysilicon spacers. The silicon nitride blocks are removed by using hot $H_3PO_4$ solution. The ultra-thin oxide is etched back using polysilicon spacers as hard mask. The polysilicon spacers and the remained thin oxides used as hard mask to define nanometer silicon island. The ultra-thin oxide layer on the silicon islands is removed and an ultra-thin oxynitride layer is formed on the surface of the silicon islands. Finally, an n+ polysilicon layer is deposited on the surface of the buried layer and the nanometer silicon islands.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method of making nanometer Si islands on a silicon wafer is disclosed here. The nanometer Si islands are fabricated to become single electron transistors. The present invention is explained with a preferred embodiment in following descriptions.

Figure 1:
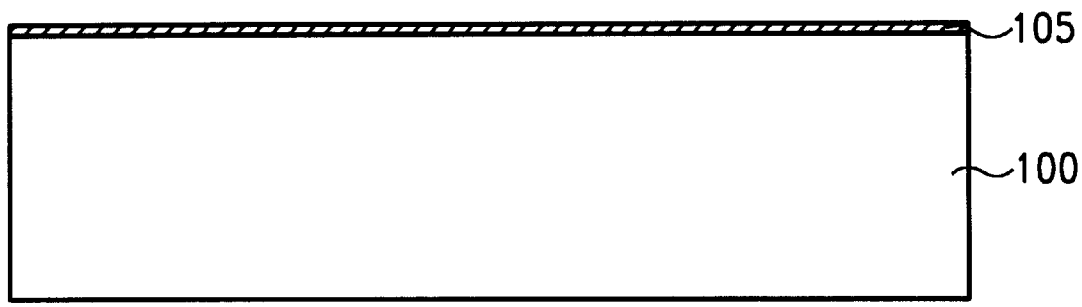
FIG. 1 is a cross sectional view of a semiconductor substrate illustrating the formation of a pad oxide on the substrate in accordance with the present invention.

Turning to FIG. 1, a substrate 100 is provided and it is a single crystal P-type substrate with <100> crystallography orientation. A pad oxide 105 is formed on the substrate 100 using thermal oxidation in an oxygen ambient and it has a thickness of between about 100 to 500 angstroms.

Figure 2:
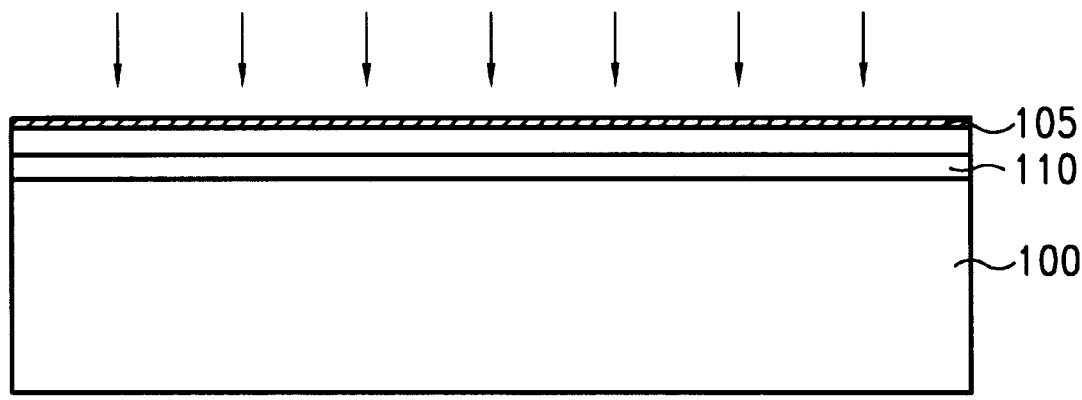
FIG. 2 is a cross sectional view of a semiconductor substrate illustrating a blanket implantation to dope oxygen ions into the substrate in accordance with the present invention.

Turning to FIG. 2, oxygen ions are implanted into the substrate 100 with high dosage and an oxygen amphorized region 110 is formed in the substrate 100. The high dosage is about $5 \times 10^{16}$ to $5 \times 10^{19}$ ions/cm$^2$ and the implanting energy is about 100 to 300 KeV.

Figure 3:
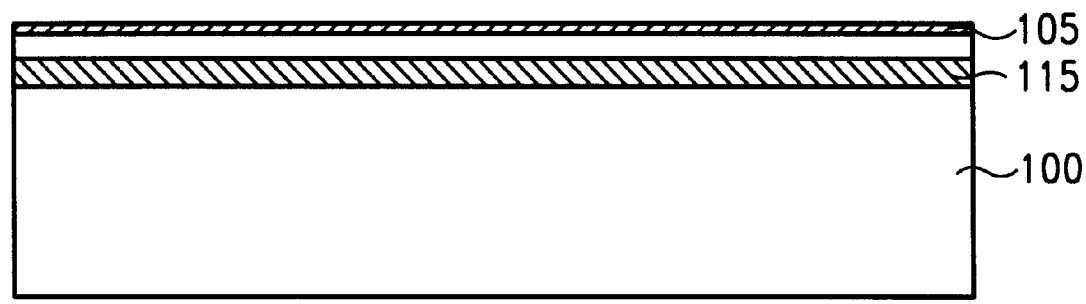
FIG. 3 is a cross sectional view of a semiconductor substrate illustrating the formation of a buried oxide in the substrate in accordance with the present invention.

Next, turning to FIG. 3, a buried oxide layer 115 is formed in the substrate 100 by using a high temperature annealing to convert the oxygen amorphized region 110 into a buried oxide layer. The annealing process is done in the neutral ambient of $N_2$ or $N_2/O_2$ mixture gases. The annealing time requires sufficient time (3–5 hours) and the annealing process uses a high temperature (1050–1250° C.). Typically, the depth of the buried oxide layer 115 is between about 0.3–0.5 micrometers. The technique of forming the buried oxide layer is the separation by implanted oxygen (SIMOX) process.

Figure 4:
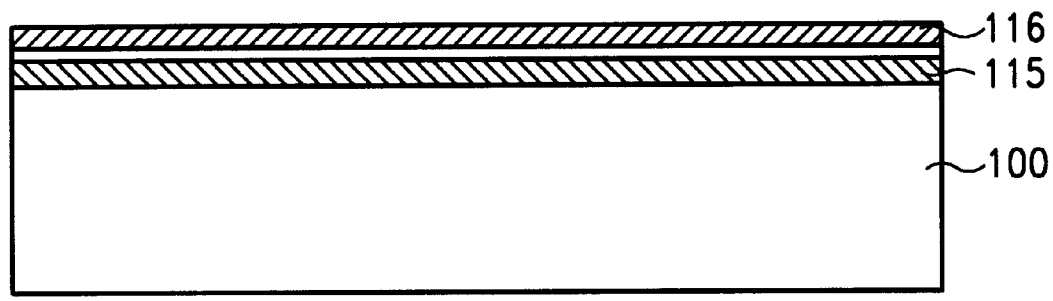
FIG. 4 is a cross section view of a semiconductor substrate illustrating the formation of a thermal oxide to form nanometer Si substrate in accordance with the present invention.

As be shown in FIG. 4, a thermal oxide 116 is formed on the substrate 100 using thermal oxidation. The thermal oxidation can reduce the thickness of the single crystal Si region between the thermal oxide 116 and the buried oxide layer 115. The Si substrate 100 between the thermal oxide 116 and the buried oxide layer 115 is about nanometer dimension because process of the silicon substrate 100 on the buried oxide 115 is converted into thermal oxide.

Figure 5:
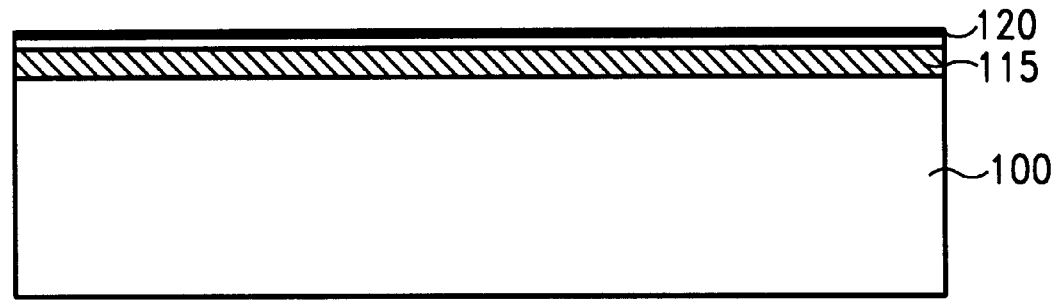
FIG. 5 is a cross sectional view of a semiconductor substrate illustrating the removing of the thermal oxide and the formation of an ultra-thin oxide in accordance with the present invention.

Referring to FIG. 5, the thermal oxide 116 is removed and an ultra-thin oxide 120 is formed on the substrate 100. Typically, the thermal oxide 116 is removed by using buffer oxide etching (BOE) solution or diluted HF solution. An ultra-thin oxide 120 is regrown on the substrate 100 using thermal oxidation and it has a thickness between about 20 to 200 angstroms.

Figure 6:
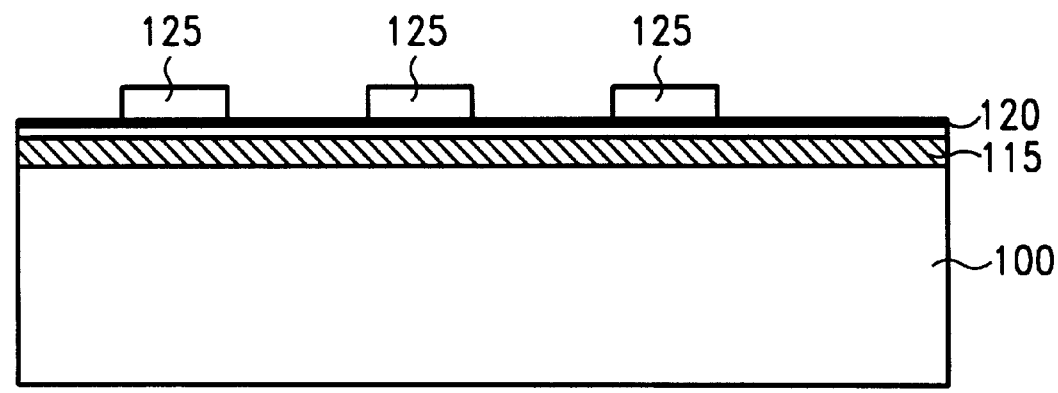
FIG. 6 is a cross sectional view of a semiconductor substrate illustrating the formation of nitride blocks on the ultra-thin oxide in accordance with the present invention.

As can be seen in FIG. 6, a silicon nitride layer is deposited on the ultra-thin oxide 120 and is then etched back to form the silicon nitride layer blocks 125. The silicon nitride blocks 125 have a thickness between about 100 to 1000 angstroms. In the preferred embodiment, the silicon nitride blocks 125 is deposited by using low pressure chemical vapor deposition (LPCVD) or plasma enhancement chemical vapor deposition (PECVD).

Figure 7:
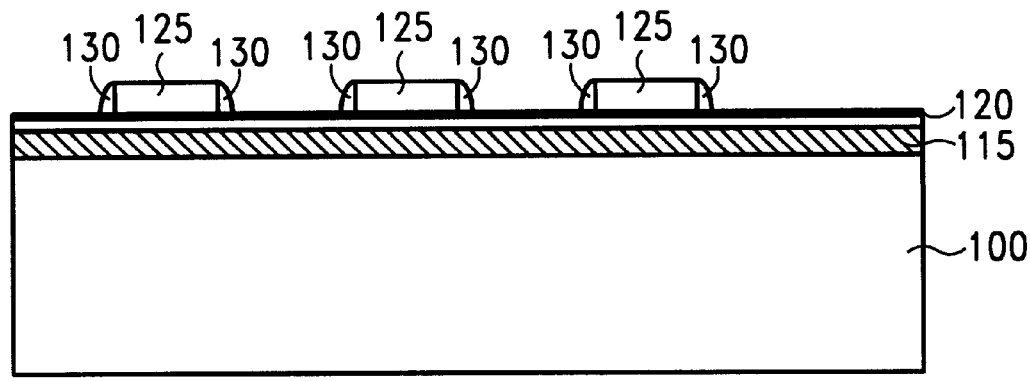
FIG. 7 is a cross sectional view of a semiconductor substrate illustrating the formation of polysilicon spacers of the nitride blocks in accordance with the present invention.

Turning to FIG. 7, a polysilicon layer is deposited on the silicon nitride blocks 125 and then etched back to form polysilicon spacers 130. The polysilicon layer is deposited by low pressure chemical vapor deposition (LPCVD) system, at the pressure of 50 to 600 mtorrs and the temperature is between about 400 to 600° C. and the thickness is between about 50 to 500 angstroms.

Figure 8:
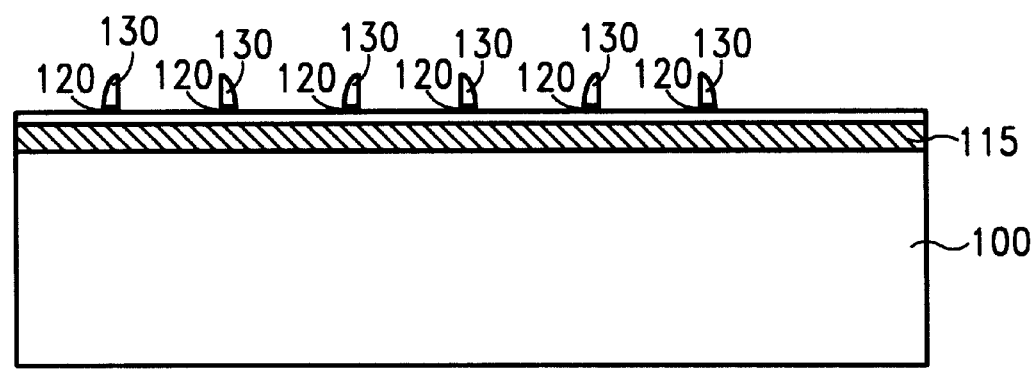
FIG. 8 is a cross sectional view of a semiconductor substrate illustrating the removing of the nitride blocks in accordance with the present invention.

Turning to FIG. 8, the silicon nitride layer 125 is removed to form silicon islands on the substrate 100. The silicon nitride layer 125 is removed by using hot phosphoric acid ($H_3PO_4$) solution. The ultra-thin oxide 120 is then drily etched back by using the polysilicon spacers 130 as hard mask. The polysilicon spacers 130 and the remaining ultra-thin oxide films are used as hard mask to form silicon islands on the substrate 100.

Figure 9:
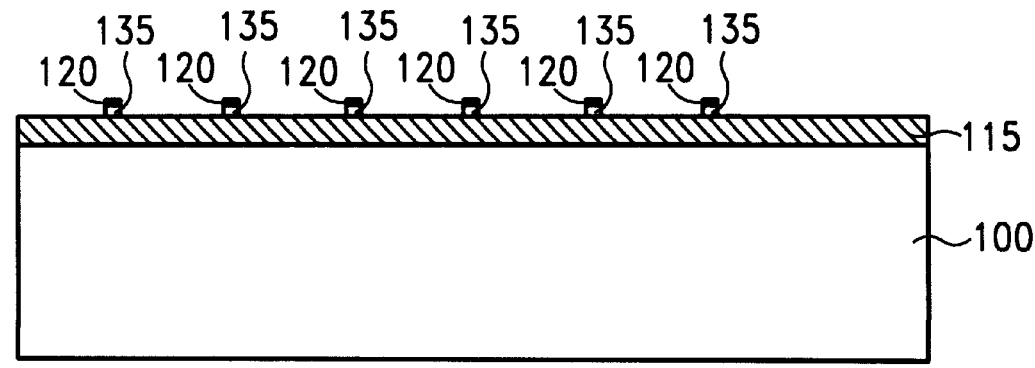
FIG. 9 is a cross sectional view of a semiconductor substrate illustrating the formation of nanometer Si wires in accordance with the present invention.

As can be seen in FIG. 9, the Si substrate 100 is etched back to form nanometer Si islands by using the polysilicon spacers 130 and the ultra-thin oxide 120 as hard mask. Afterwards, nanometers Si wires 135 are formed over the buried oxide layer. In the preferred embodiment, a dry etching, such as plasma etching, is performed to form the silicon wire 135 on the substrate 100.

Figure 10:
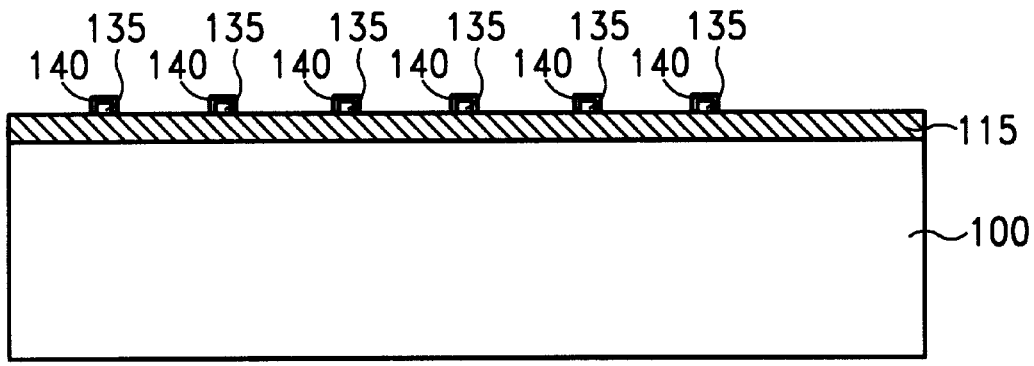
FIG. 10 is a cross sectional view of a semiconductor substrate illustrating the formation of spacers of the gates and active region in the substrate.

As can be shown in FIG. 10, after the silicon wires 135 are formed, an ultra-thin oxynitride film 140 was grown on nanometer Si island by using $N_2O$ or NO gas. The ultra-thin oxynitride film 140 has a thickness between about 10 to 100 angstroms.

Figure 11:
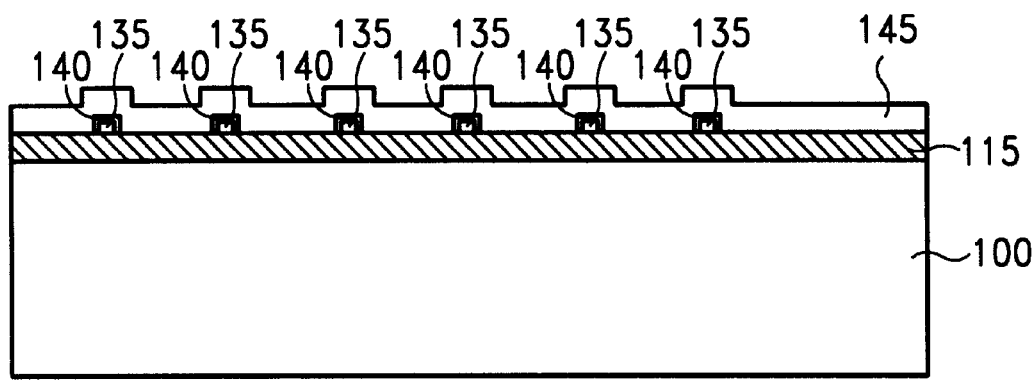
FIG. 11 is a cross sectional view of a semiconductor substrate illustrating that a thick oxide layer is formed on the surface of the substrate and a metal contact is formed in the thick oxide layer.

Turning to FIG. 11, a n+ polysilicon layer 145 is deposited as gate material of single electron tunneling (SET) device. In one case, the n+ polysilicon layer 145 is formed of in-situ doped polysilicon material and it is deposited by using conventional chemical vapor deposition (CVD), adding phosphorus gas or arsenic gas into CVD reactant gas as a doping source. The thickness of the n+ polysilicon is between about 500 to 2000 angstroms.

Figure 12:
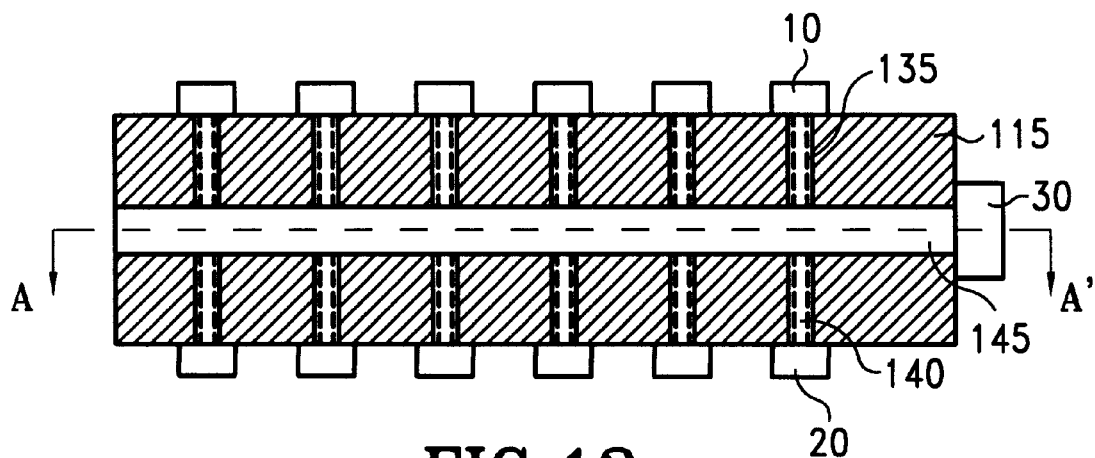
FIG. 12 shows a top view of nanometer silicon single electron transistor devices in accordance with the present invention.

After the above process, several nanometer silicon single electron tunneling (SET) devices are fabricated on the substrate 100 and these devices form a memory array. Referring to FIG. 12, a top view of the memory array is demonstrated and FIG. 11 is a cross sectional view of the FIG. 12 along AA' line. In this figure, the memory array is constructed on the buried oxide layer 115. The n+ doping polysilicon layer 145 is a wide band over the buried oxide layer and the silicon wires 135 is cross the polysilicon layer 145 to form single electron transistors (SET). In the drawing, the dash lines show the oxynitride layer 140 on the silicon wires 135. The two terminals of the silicon wires are connected to a source 10 and a drain 20. Besides, the n+ doping polysilicon 145 is connected to a gate 30. The memory array is controlled by using the source 10, the drain 20 and the gate 30. In the present invention, a serial of single electron transistor (SET) is fabricated and nanometer single electron transistors are manufactured in the substrate 100.

As is understood by a person skilled in the art, the foregoing preferred embodiment of the present invention are illustrated of the present invention rather than limiting of the present invention.

While the preferred embodiment of the invention has been illustrated and described, it will be appreciated that various changes can be made therein without departing from the spirit and scope of the invention.

What is claimed is:

1. A method of manufacturing a single election transistor, the method comprising the steps of:

forming a pad oxide over a substrate;

performing an ion implantation using oxygen ions as dopant into said substrate;

performing an annealing process on said substrate to form a buried oxide layer in said substrate;

forming a thermal oxide layer on said substrate to reduce the thickness of said substrate on said buried layer;

removing said thermal oxide layer;

forming a silicon oxide layer on said substrate;

forming a silicon nitride block over said silicon oxide layer to defined an isolation pattern;

forming polysilicon spacers on said silicon nitride block;

removing said silicon nitride block;

etching back said substrate to form a silicon He by using the polysilicon spacers as a hard mask;

forming an oxynitride layer to be a cap layer of the silicon wire; and forming a polysilicon layer over said silicon wire to form a single electron transistor (SET).

2. The method of claim 1, wherein said pad oxide has a thickness between about 100 to 500 angstroms.

3. The method of claim 1, wherein said ion implantation has a dosage between about $5 \times 10^{16}$ to $5 \times 10^{19}$ ions/cm$^2$ and a energy between about 100 to 300 KeV.

4. The method of claim 1, wherein said annealing process has a temperature between about 1050 to 1250° C.

5. The method of claim 1, wherein said anneal is performed in a $N_2$ and $N_2/O_2$ gas ambient.

6. The method of claim 1, wherein forming said oxynitride layer to be a cap layer is formed in a $N_2O$ and NO gas ambient.

7. The method of claim 1, wherein forming said polysilicon layer over said silicon wire is formed of an n+ polysilicon material.

8. The method of claim 1, wherein said oxynitride layer has a thickness between about 10 to 100 angstroms.

9. The method of claim 1, wherein said silicon oxide layer has a thickness between about 20 to 200 angstroms.

10. A method to manufacture a memory array of single electron transistors, the method comprising the steps of:

forming a pad oxide on a silicon substrate;

performing an oxygen ion implantation on said substrate to form an oxygen amorphized region;

performing an annealing process to form a buried oxide layer;

forming a thermal silicon oxide layer on said substrate to form a nanometer silicon island;

removing said thermal silicon oxide layer;

forming a silicon oxide layer on said substrate;

forming polysilicon spacers on said silicon nitride blocks;

removing said silicon nitride blocks;

etching said silicon substrate to form a plurality of silicon wires using said polysilicon spacers as a hard mask;

removing said polysilicon spacers;

forming an oxynitride layer to be a cap layer of said silicon wires; and forming a polysilicon layer over said oxynitride layer and said buried oxide layer to form a plurality of single electron transistors.

11. The method of claim 10, wherein said pad oxide has a thickness between about 100 to 500 angstroms.

12. The method of claim 10, wherein said ion implantation has a dosage between about $5 \times 10^{16}$ to $5 \times 10^{19}$ ions/cm$^2$ and a energy between about 100 to 300 KeV.

13. The method of claim 10, wherein said annealing process has a temperature between about 1050 to 1250° C.

14. The method of claim 10, wherein said anneal is performed in a $N_2$ and $N_2/O_2$ gas ambient.

15. The method of claim 10, wherein forming said oxynitride layer is formed in a $N_2O$ and NO gases ambient.

16. The method of claim 10, wherein forming said polysilicon layer over said silicon wires is formed of a n+ polysilicon material.

17. The method of claim 10, wherein said oxynitride layer has a thickness between about 10 to 100 angstroms.

18. The method of claim 10, wherein said silicon oxide layer has a thickness between about 20 to 200 angstroms.

* * * * *